United States Patent [19]
Comeau

[11] Patent Number: 5,329,228
[45] Date of Patent: Jul. 12, 1994

[54] TEST CHIP FOR SEMICONDUCTOR FAULT ANALYSIS

[75] Inventor: Alain Comeau, Bromont, Canada

[73] Assignee: Mitel Corporation, Ontario, Canada

[21] Appl. No.: 910,029

[22] PCT Filed: Nov. 26, 1990

[86] PCT No.: PCT/CA90/00416

§ 371 Date: Jul. 23, 1992

§ 102(e) Date: Jul. 23, 1992

[87] PCT Pub. No.: WO91/08585

PCT Pub. Date: Jun. 13, 1991

[30] Foreign Application Priority Data

Dec. 1, 1989 [CA] Canada ................... 2004436

[51] Int. Cl.[5] ............................................. G01R 15/12
[52] U.S. Cl. ..................................... 324/765; 324/73.1
[58] Field of Search ............................... 324/158, 73

[56] References Cited

U.S. PATENT DOCUMENTS

| | | | |
|---|---|---|---|
| 4,404,519 | 9/1983 | Wescott | 324/73 |
| 4,719,411 | 1/1988 | Buehler | 324/73 |
| 4,835,466 | 5/1989 | Maly et al. | 324/158 |
| 4,961,192 | 8/1990 | Grimes | 371/37.1 |

Primary Examiner—Kenneth A. Wieder
Assistant Examiner—B. Bowser
Attorney, Agent, or Firm—Marks & Clerk

[57] ABSTRACT

A semiconductor test chip for use in semiconductor fabrication fault analysis, comprises an n×m array of transmission gate cells arranged such that within a given row respective strips of conductive material of a first type form common source and drain electrodes for the transistors of the row, the sources and drains of each row being independent, and within a column strips of conductive material of a second type form common gate electrodes such that each column of transistors can be turned on independently. An input circuit permits a predetermined bit pattern to be selectively applied to the inputs of the rows of transmission gate cells. A demultiplexer including output transmission gates is connected to respective outputs of the rows of the array for selectively addressing the output of each row of transmission gate cells. A centre-pulled operational amplifier is connected to the outputs of said output transmission gate cells, and the output of the operational amplifier is coded according a logic scheme having three levels. Another demultiplexer is provided for selectively turning on each column of transmission gate cells. In this way, the physical nature and location of defects in the chip can be determined from said multi-level coded output. The results are useful for characterizing process yields and reliability, They can also be used for high level yield modelling.

17 Claims, 4 Drawing Sheets

TEST CHIP FOR SEMICONDUCTOR FAULT ANALYSIS

This invention relates to a semiconductor test chip for use in semiconductor fabrication fault analysis.

Semiconductor integrated circuits, or chips as they are commonly known, which fulfil a variety of functions are now in widespread use. They are fabricated by selectively implanting impurities into, and applying conductive and insulating layers onto, a semiconductor, for example silicon, substrate. Each chip may contain a large number of components co-operating to fulfil a predetermined function.

Semiconductor chips are not manufactured individually, but rather as an assembly of a hundred or more chips on a "wafer", which is then divided up to produce the individual chips. An ongoing problem in the manufacture of semiconductor chips has to do with yield. Because of various faults that can occur in fabrication of a wafer, a significant number of the chips have to be discarded for one reason or another, thereby driving up the cost of the individual chips. An ongoing objective is to improve manufacturing techniques to increase the percentage yield per wafer and thereby drive down the unit costs.

In order to improve manufacturing techniques, and thereby increase yield, it is necessary to learn more about the defects that occur in the manufacturing process. A number of sophisticated techniques, such as on-line yield modelling, are available for this purpose. The present invention constitutes an important tool in the application of these techniques by allowing studies to be carried out on the specific types of defects occurring in semiconductor test chips for any given manufacturing process. When changes are made to a manufacturing process, the process can be used to manufacture a wafer containing test chips according to the invention, thereby permitting the type and number defects induced by the process to be studied. From this data improvements to the manufacturing process can be implemented.

Test chips have been employed for many years. However, while in the prior art while such chips have been able to identify defective cells, they have not been able to physically identify the defect within a particular cell. This latter operation must be done manually with the aid of, for example, optical, scanning, or transmission electron microscopes.

U.S. Pat. No. 4,719,411 to Buehler, issued Jan. 12, 1988, describes set of addressable test structures, each of which uses addressing schemes to address individual elements of the structure in a matrix. In Buehler, the addressable elements consist of invertor/transmission gate cells connected to an array of probe pads. By taking measurements of the output voltage, defective cells can be identified. Buehler does not permit the physical nature of the faults within the cells to be determined.

U.S. Pat. No. 4,835,466 to Maly et al, issued May 30, 1989, describes a meander structure applied to a semiconductor substrate. By measuring the resistance between points on the meander, faulty points can be identified. As is the case in Buehler, the electrical measurements do not give detailed information about the physical nature of the faults within the cells. Also as the structure of Maly's chip is not representative of practical active devices, the results are of questionable validity for application to real working chips.

Other prior art patents dealing with faulty cell identification are U.S. Pat. No. 4,801,869 to Sproggis, U.S. Pat. No. 4,782,288 to Vinto, U.S. Pat. No. 4,739,388 to Packeiser et al, and U.S. Pat. No. 4,654,872. None of these patents discloses an apparatus for determining the physical nature of the defects present within a faulty cell.

An object of the present invention is to alleviate the aforementioned disadvantages of the prior art.

According to the present invention there is provided a semiconductor test chip for use in semiconductor fabrication fault analysis, comprising an n x m array of transmission gate cells arranged such that within a given row respective strips of conductive material of a first type form common source and drain electrodes for the transistors of the row, the sources and drains of each row being independent, and within a column strips of conductive material of a second type form common gate electrodes such that each column of transistors can be turned on independently; input means for selectively applying a predetermined bit pattern to inputs of the rows of transmission gate cells; multiplexer means including output transmission gates connected to respective outputs of the rows of said array for selectively addressing the output of each row of transmission gate cells; means for selectively turning on each column of transmission gate cells; a centre-pulled operational amplifier connected to the outputs of said output transmission gate cells; and means for coding the output of said operational amplifier according a logic scheme having at least three levels, whereby the physical nature and location of defects in the chip can be determined from said multi-level coded output.

Preferably, the first type of conductive material is metal and the second type is poly (polycrystalline silicon).

The invention also provides a method of evaluating the performance of a semiconductor fabrication process, comprising fabricating a test chip comprising an n×m array of transmission gate cells arranged such that within a given row respective strips of conductive material of a first type form common source and drain electrodes for the transistors of the row, the sources and drains of each row being independent, and within a column strips of conductive material of a second type form common gate electrodes such that each column of transistors can be turned on independently; input means for selectively applying a predetermined bit pattern to inputs of the rows of transmission gate cells; demultiplexer means including output transmission gates connected to respective outputs of the rows of said array for selectively addressing the output of each row of transmission gate cells; means for selectively turning on each column of transmission gate cells; a centre-pulled operational amplifier connected to the outputs of said output transmission gate cells; and means for coding the output of said operational amplifier according a logic scheme having at least three levels, whereby the physical nature and location of defects in the chip can be determined from said multi-level coded output, said method comprising fabricating said test chip by said process, applying said predetermined bit patterns to said row inputs, sensing the tri-level codes at the row outputs for the predetermined bit patterns applied to the row inputs at Hi-Z, i.e. with all transmission gates off, and with the columns of cells selectively turned ON, and determining from the tri-level coded outputs the physical nature and location of the defects in the chip.

The semiconductor test chip is configured such that the matrix of transmission gates and peripheral circuitry having a die size of 283 mils by 285 mils, which is a typical current die size. It is manufactured in the form of a 3 μm, single poly, single metal device A 3 μm, single poly, double metal device can be fabricated by supplying a new mask for the first metal layer.

Since the defects to be detected originate essentially from the manufacturing process used to fabricate the wafer, and the chips according to the invention have a similar structure to active chips, the studies carried out on the test chips according to the invention are applicable to other types of active chips designed for incorporation into practical devices.

The chip can identify faulty cells and distinguish between 21 different types of physical defect with a possible ambiguity of only 2 pairs. Unlike prior art chips, the physical nature of the defects can be determined from the electrical measurements, and manual defect identification is generally not necessary, although it can be used for confirmation or to resolve any residual ambiguity in the results.

The faults that can effect the operation of a semiconductor chip are numerous, but they can always be classified electrically as an open or short circuit. Since poly (polycrystalline silicon) is used as the gate electrode, and metal is used as the source and drain electrode, it has been found in accordance with the invention that the electrical characteristics of the faulty cell are closely related to the physical faults.

The faults can occur within a transmission gate cell, each of which consists of a pair of n type and p type field effect transistors, can be seen by setting out a matrix representing the different electrodes of the transmission gate cell as shown in Table 1 below.

TABLE I

|     | S  | D  | Gn | Vss | Vdd |
|-----|----|----|----|----|-----|
| D   | X− |    |    |    |     |
| Gn  | X− | X− |    |    |     |
| Gp  | X− | X− | X− |    |     |
| ss  | X− | X− | X− | X  |     |
| Vdd | X− | X− | X  | X− | X   |

Total = 12 shorts

In the above Table, the symbols have the following meanings.
S = Source
D = Drain
Gn = Gate n-type
Gp = Gate p-type
X− = possible short
X = uninteresting short In this table, $V_{dd}$-$V_{ss}$ shorts have not been counted because they imply complete failure of the chip, and Gn-$V_{dd}$ and Gp-$V_{ss}$ shorts have not been counted as being physically improbable due to the physical layout of the chip. These shorts have been designated in the table by an X.

To the shorts set out in Table 1 must be added the open circuit that can occur on all cell electrodes and the open circuit between the internal nodes of the transmission gate itself. These faults will be described later, but it turns out that there are ten such faults including an open drain or an open source on one transistor. Since the latter faults are electrically and physically identical, there are a total of twenty defects, to which should be added the faults that occur between neighbouring cells. These can be determined by setting out the list of terminals of one cell in the form of a matrix similar to Table 1, and surprisingly it appears that because of the design only two faults can occur: drain-source short and gate-gate short. The gate-gate short is improbable because of the larger separation between cells of the same row that there are twenty-one faults of interest to identify.

These faults will now be discussed in more detail. The faults will be identified using a three or four letter code, in which:

N,P: used as the last letter, defines channel type.
O: used in the last two letters, signify an open node.
G,D,S: used in the first two letters, identify transistor electrodes.
s: used in the first two letters, substrate.
Xn: used in the first two letters, the index n identifies the neighbouring cell; X can be G,D, or S.

In the following discussion, a short is assumed unless an open is specified.

The electrical faults that can occur within a cell are identified in Table III:

TABLE III

| DEFECT LIST | |
|---|---|
| DsN: | drain substrate short |
| DsP: | |
| GSN: | gate source short |
| GSP: | |
| GDN: | |
| GDP: | |
| GG: | gate n-gate p short |
| DS: | drain-source short |
| $S_nD_{n-1}$: | short of the drain to the source of the transistor below (Metal-Metal) |
| GOP: | gate open |
| GON: | |
| $S_{n-1}S_nO$: | source open between cells of the same row |
| SSO: | source open between transistors of the same cell |
| DDO: | |
| $D_nD_{n+1}O$: | |
| SsN: | source-substrate short |
| Ssp: | |
| GsN: | |
| GsP: | |
| DON: | drain open N channel, note: SON is the same |
| DOP: | |

In Table III, only defects affecting two electrodes simultaneously are considered. Information about defects affecting three or more electrodes is considered unnecessary, but if it is desired to take such defects into account, this can be done by similar reasoning.

The electrical defects identified in Table III correspond to physical defects shown in Table IV below:

TABLE IV

| DsN | Dsp | Missing implant or excessive leakage |
|---|---|---|
| SsN | SsP | caused by stacking faults** |
| GSN | GSP | gate oxide integrity, intermediate |
| GDN | GDP | dielectric pinholes* |
| GsN | GsP | |
|  | GG | poly bridging |
|  | DS | missing poly over channel, extra P-well |
|  | $S_nD_{n-1}$ | M1 bridging junction bridging** |
| GON | GOP | missing poly, bad contact on gate** |
| $S_{n-1}S_nO$ | SSO | missing metal |
| DDO | $D_nD_{n+1}O$ | |
| DON | DOP | bad contact at drain or source |
| SON | SOP | |

*low probability
**very low probability

The defects identified in Table III were electrically simulated for the test chip in accordance with the invention using the computer program SPICE to determine their electrical consequences.

The simulation was carried out, using what should be the normal electrical pattern, by taking each cell of the array, applying a logic 0 and 1 to its source, and holding the sources of the closest row neighbours respectively at logic 0 and 1 levels.

This scheme can be represented by the Table V below:

TABLE V

| Patterns inputs | Row | Possible Bit applied to row | | | |
|---|---|---|---|---|---|
| Upper closest neighbour | $n-1$ | 0 | 1 | 0 | 1 |
| probed cell | $n$ | 0 | 0 | 1 | 1 |
| Lower closest neighbour | $n+1$ | 0 | 1 | 0 | 1 |

In the first column, a 0 is applied to the sources of the adjacent rows, with a 0 being applied to the source of the probed cell. In the second column a 1 is applied to the sources of the row neighbours, with a 0 applied to the source of the probed cell; in the third column a 0 is applied to the source of the row neighbours with a 1 applied to the probed cell; and in the fourth column a 1 is applied to the sources of the row neighbours with a 1 applied to the source of the probed cell. This result is achieved by applying the respective patterns shown in each column of Table V to the inputs to the rows of the array. Four bit patterns can therefore be applied to the inputs of array.

These input bit patterns for the array are obtained by coding the T/C and D3 input (True/complementary and Data inputs for the input circuit) of the semiconductor chip in the following manner:

TABLE VI

| row | | Bit pattern applied to row inputs | | | |
|---|---|---|---|---|---|
| | $n-1$ | 0 | 1 | 0 | 1 |
| | $n$ | 0 | 0 | 1 | 1 |
| | $n+1$ | 0 | 1 | 0 | 1 |
| Coding applied to input circuit to achieve above bit patterns | | | | | |
| coding | T/C | 1 | 0 | 0 | 1 |
| | D3 | 1 | 0 | 1 | 0 | For n even |
| | D3 | 1 | 1 | 0 | 0 | For n odd |

The simulation was carried out by first turning off all the transmission gates (HI-Z) and sequentially sensing the voltage at the outputs of all the rows from the bottom up, and second by selectively turning on each column and repeating the above step for each column.

The outputs seen by the demultiplexer are classified as 0, 1 or X according to the following scheme:

TABLE VII

| | 0 | X | 1 | |
|---|---|---|---|---|
| HI-Z | V<1V | 1<V<4 | V>4V | note Vdd = 5V |
| ON | V<.4 | .4<V<4.25 | V>4.25 | |

HI-Z (High impedance) implies that all transmission gates are off so in the normal state no signal should pass through the array. ON implies one of the columns is switched on.

The normal bit pattern applied to sequentially to the input of each probed row is 0011 as shown in table VI. In the HI-Z state, with no defects present, the outputs sensed on all rows should be XXXX since no signal should pass through the array. In the ON-state, with no defects present, the output sensed on the probed row should be 0011. When a defect occurs, the sensed patterns change according to the nature and location of the defect as shown in Table VIII, wherein even numbered cells and bit pattern order are retained as previously described with reference to Table V.

TABLE VIII

| Defect possible | HI-Z | HI-Z Y-dir | Local | X-dir | Y-dir | XY |
|---|---|---|---|---|---|---|
| DsN | 0000 | | 00XX | 00XX | | X |
| DsP | 1111 | | XX11 | XX11 | | X |
| GSN | XX0X* | XX0X* | XX11 | 00XX | XX11 + | XY |
| GSP | X1XX* | X1XX* | 00XX | XX11 | | XY |
| GDN | 0000 | | 00XX | XX11 | | XY |
| GDP | 1111 | | XX11 | 00XX | | XY |
| GG | 0011 | 0011 | | | | XY |
| DS | 0011 | | | | | Y |
| $S_nD_{n-1}$ | 0011 | | 0XX1 | 0XX1 | | Y |
| GOP | 00XX | | | | | Y |
| GON | XX11 | | | | | Y |
| $S_nS_{n-1}O$ | | | XXXX | XXXX + | | XY |
| SSO | | | XX11 | XXXX* | | XY |
| DDO | | | 00XX | XXXX - | | XY |
| $D_nD_{n+1}O$ | | | XXXX | XXXX - | | XY |
| SsN | | | 00XX | 00XX | | Y |
| Ssp | | | XX11 | XX11 | | Y |
| GsN | | | XX11 | | XX11 + | X* |
| GsP | | | 00XX | | 00XX + | X* |
| DON | | | XX11 | | | XY |
| DOP | | | 00XX | | | XY |

In this table the HI-Z column represents the code seen at the output of the probed row in the high impedance state as the 0011 bit pattern is applied to its input, with the inputs of the other rows having applied thereto bit patterns according to table V. As indicated above, in the absence of defects, the output pattern should be XXXX. The patterns shown indicate the outputs to be expected with certain types of defect. If the output pattern is marked with a *, the code appears on the nearest neighbours only; otherwise it appears on all the rows or columns. To simplify test program, these are treated as defect free.

The HI-Z Y dir column shows those defects that cause the error to propagate from the row containing the defective cell to the bottom of the array. By sequentially probing the rows, the Y coordinate of the cell can be determined. The output pattern is marked with a *, the shown pattern is seen only on even cells.

The Local column shows the sensed output pattern for all rows when a defective cell of a probed row is selected.

The X dir column shows the code seen on the defective row as the columns are selected in turn; +means from defect position to far right, −from far left to defect position.

The Y dir column shows the code seen in the defective column as the output rows are scanned in turn; +means from the defect to the bottom of the array, −means from the top of the array to the row containing the defective cell.

The X-Y Possible column indicates the coordinates that can be identified from the output codes; a * means the identification is not straight forward for the missing direction but can be calculated approximately.

This table shows how the physical defects can be electrically identified using the described semiconductor chip. All the information is present to construct a test algorithm.

The invention will now be described in more detail, by way of example only, with reference to the accompanying drawings, in which.

Figure 1:
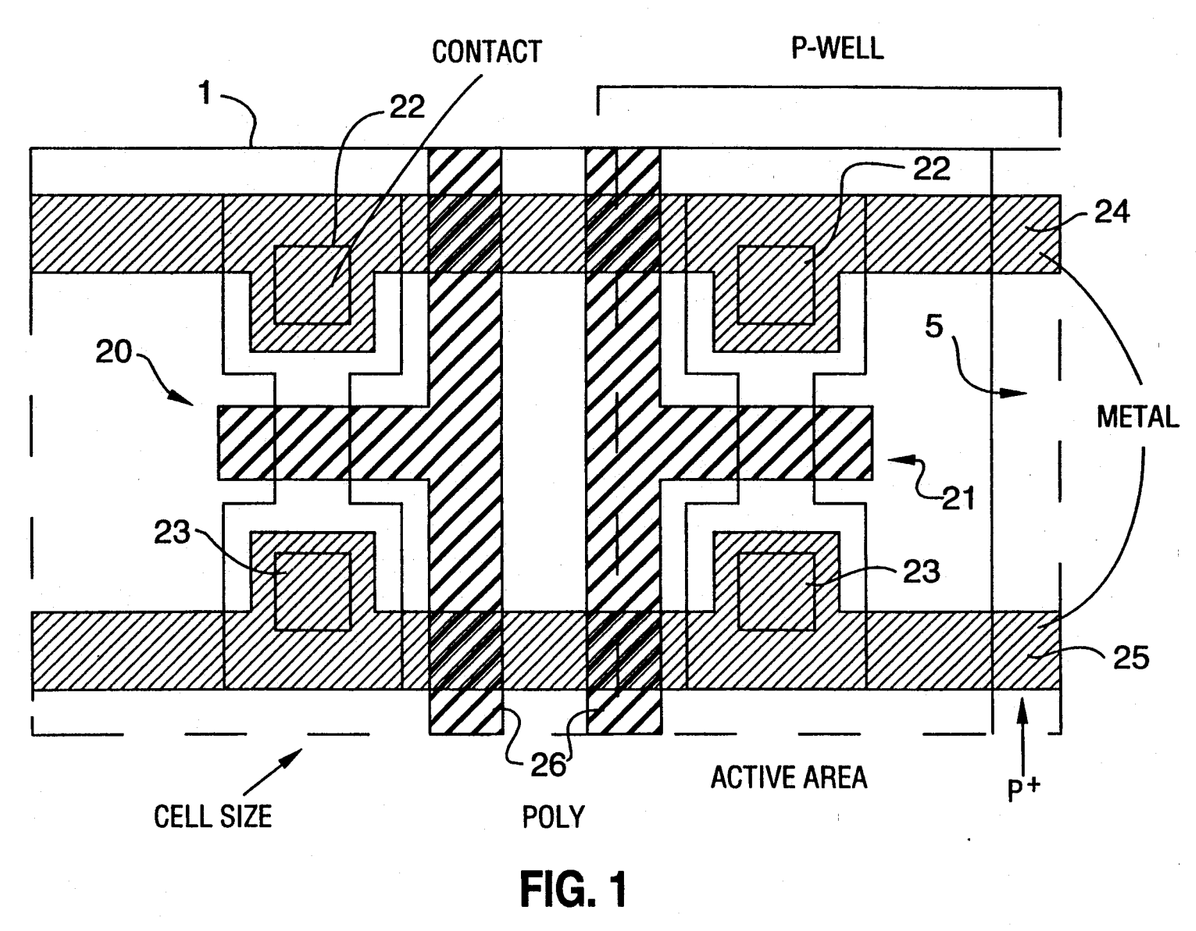
FIG. 1 is a schematic diagram of a transmission gate cell of the array in the semiconductor fabrication test chip according to the invention.

A transmission gate is shown in FIG. 1. Minimum spacing is employed except for the separation between two cells of the same row. Within, a row, all sources and drain are common to all transistors, each column of transmission gates can be turned on independently.

In FIG. 1, each cell 1 forming a transmission gate consists of a pair of n and p channel Field Effect Transistors (FETs) 20, 21 with source and drain regions 22, 23. Symmetrically disposed horizontal metal strips 24, 25 run across the array and form respective common source and drain electrodes for the FETS. Strips of poly (polycrystalline silicon) 4 forming the gate electrodes extend vertically (The directions horizontal and vertical are merely used for convenience and relate to their appearance in the drawings), i.e. perpendicular to the metal strips 24, 25. Due to this configuration, the gates of the n and p channel devices give information about poly-related defects, and the source and drains give information about metal-related defects.

The P+ strip 5 in the P-well is used to ensure good grounding and avoid latch-up problems. This is not needed for the N− substrate. The transmission gates are designed to a minimum size and are similar to transistors found in conventional high-density circuits.

Figure 2:
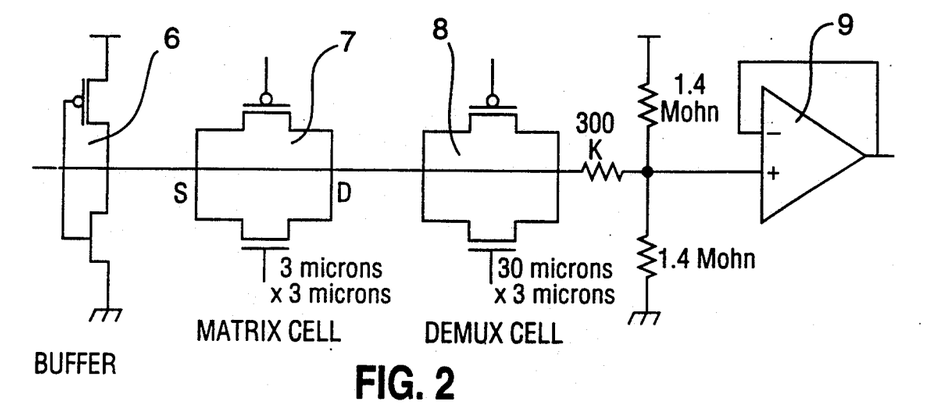
FIG. 2 is an electrical diagram of the output circuit for the chip.

As shown in FIG. 2, the semiconductor test chip has an input buffer 6, consisting of a pair of field effect transistors, a transmission gate matrix cell 7 connected in turn to an output transmission gate cell 8, which has its output connected to a centre-pulled operational amplifier 9. The output configuration, employing transmission gate 8 and centre-pulled operational amplifier 9, ensures that if the transmission gate 8 is floating, an accidental 0 or 1 does not occur and that the output is within the linear range of the operational amplifier.

Figure 3:
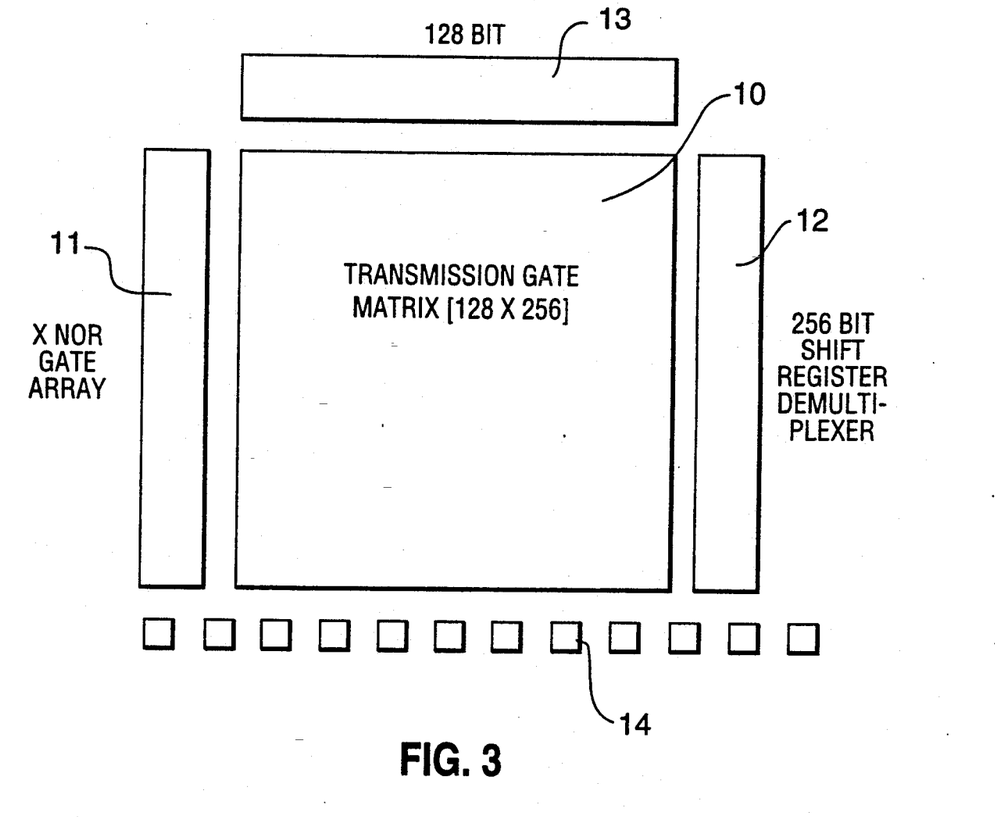
FIG. 3 shows the physical layout of the chip.

FIG. 3 shows the physical layout of the chip. The main transmission gate array consists of a 128×256 cell matrix to which the source voltage Vs is supplied by an exclusive nor gate array 11. The output of the transmission gate array 10 is connected to a 256 bit shift register (demultiplexer) 12 through the centre-pulled output transmission gates as described in FIG. 2.

A 128 bit static shift register 13 supplies the gate bias to the n and p channels of each column, the p channel being connected to the complement output of the device.

Twelve pads 14 are used to operate the chip. Standard input protection is used on all the pads, which are disposed on one side of the chip to save as much silicon as possible.

The chip has the advantage of being relatively large. The support circuitry area that varies linearly with the chip diameter. The sensitive area of the transmission gate matrix varies according to the square of the chip diameter. The physical dimensions of the different building blocs of the chip are as follows:

| | |
|---|---|
| Overall dimensions of chip | 7188 × 7239 $\mu$m |
| Overall dimensions TG gate array | 5120 × 5888 $\mu$m |
| Width of XOR input array | 500 $\mu$m |
| Width of demultiplexer (12) | 1400 $\mu$m |
| Width of demultiplexer (13) | 700 $\mu$m |
| Separation of array from demux. | 50 $\mu$m |
| Pad size | 5 mils |
| Area | 52.0 × $10^6$ $\mu$m$^2$ |
| Sensitive area | 30.1 × $10^6$ $\mu$m$^2$ |
| Controls area | 22.0 × $10^6$ $\mu$m$^2$ |
| Sensitive area | 57% of total |

Figure 4:
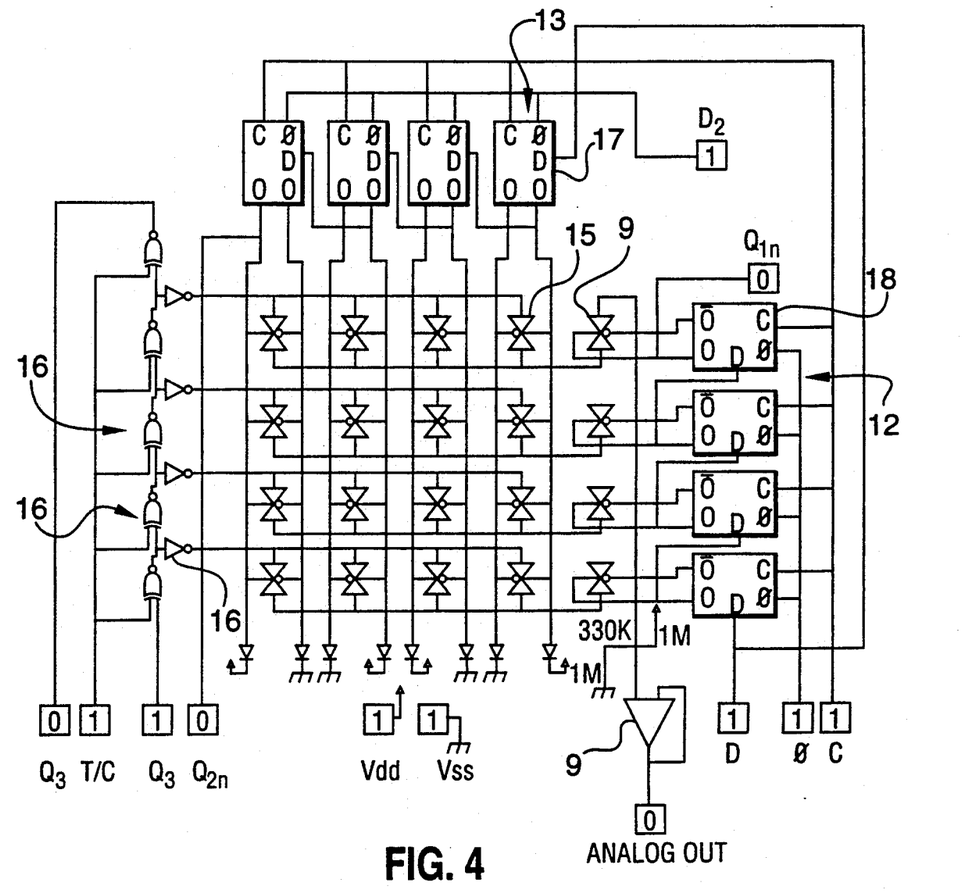
FIG. 4 is an electrical representation of a 4×4 array.

FIG. 4 shows in detail, for the purposes of illustration, a 4×4 array of transmission gate cells 15 having an input circuit 16 consisting of exclusive OR gates 16′ and inverters 16″ at the row inputs, flip-flops 17 providing bias shift register 13, and flip-flops 18 providing output to multiplexer 12. By applying the codes shown in Table VI to the T/C and D3 inputs of the input 16 16, the desired bit patterns can be applied to the inputs of the rows of the array.

The centre-pulled transmission gates 8 forming part of the demultiplexer 12 are (3 $\mu$×50 $\mu$) transmission gates connected to the outputs of the cell rows.

Figure 5:
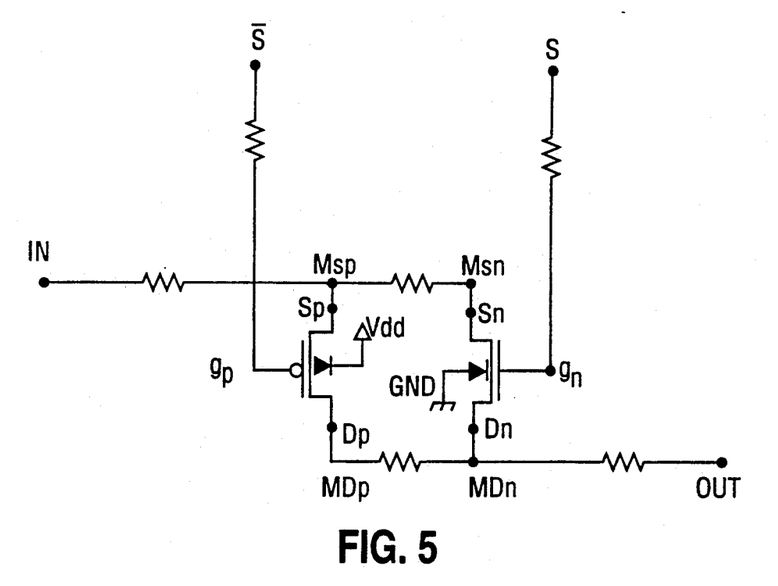
FIG. 5 is an electrical diagram of a cell showing the possible faults occurring within the cell nodes.

FIG. 5 shows the electrical configuration of the nodes within a transmission gate cell referred to in the general discussion above. The nodes are identified according to their standard designations and show the additional ten open circuit defects, of which only eight are electrically different, that can occur.

The described chip is a valuable tool in characterizing process yields and can be used for high level yield modelling. This permits fabrication techniques, and thus the yields of practical active wafers, to be improved.

I claim:

1. A semiconductor test chip for use in semiconductor fabrication fault analysis of CMOS Integrated Circuits, characterized in that it comprises an n×m array of transmission gate cells arranged such that within a given row respective strips of conductive material of a first type form common source and drain electrodes for the transistors of the row, the sources and drain of each row being independent, and within a column strips of conductive material of a second type form common gate electrodes such that each column of transistors can be turned on independently; input means for selectively applying a predetermined binary bit pattern to inputs of the rows of transmission gate cells, multiplexer means including output transmission gates connected to respective outputs of the rows of said array for selectively addressing the output of each row of transmission gate cells; means for selectively turning on each column of transmission gate cells; a center-pulled operational amplifier connected to the outputs of said output transmission gate cells; and means for coding the output of said operational amplifier according to a three-level logic scheme having logic states 0, 1, X, where 0 represents an output voltage in a first predetermined range, X represents an output voltage in a second predetermined range, and 1 represents an output voltage in a third predetermined range.

2. A semiconductor test chip as claimed in claim 1, characterized in that said first type of material is metal and said second type of material is polycrystalline silicon.

3. A semiconductor test chip as claimed in claim 2, characterized in that said scheme is such that the cells are probed by applying to the inputs of all the rows, said row inputs being connected to the sources of all the cells in the row, a logic 0 and 1 according to the following scheme:

| Row | Bit Patterns | | | |
|---|---|---|---|---|
| n−1 | 0 | 1 | 0 | 1 |
| n | 0 | 0 | 1 | 1 |
| n+1 | 0 | 1 | 0 | 1 |

4. A semiconductor test chip as claimed in claim 3, arranged such that the cells are probed first by turning off all transmission gate cells (HI-Z) and probing all rows by sequentially applying normal bit patterns thereto and sensing the tri-level outputs, and second by selectively turning on each column and again sensing the tri-level outputs.

5. A semiconductor test chip as claimed in claim 1, characterized in that said output is coded according to a tri-level logic scheme, a first level corresponding to a low voltage range, a second level corresponding to an intermediate voltage range, and a third level corresponding to a high voltage range, and the physical nature and location of defects in the chip are determined from the tri-level codes appearing at the outputs of each row when the predetermined bit patterns are applied to the row inputs.

6. A semiconductor test chip as claimed in claim 1, characterized in that said input means comprises an exclusive OR gate array.

7. A semiconductor test chip as claimed in claim 1, characterized in that said input means comprises an exclusive NOR gate array.

8. A semiconductor test chip as claimed in claim 1, characterized in that said input means comprises a shift register.

9. A semiconductor test chip as claimed in claim 1, characterized in that said input means comprises a multiplexer.

10. A semiconductor test chip as claimed in claim 1, characterized in that said output means comprises a shift register.

11. A semiconductor test chip as claimed in claim 1, characterized in that said means for selectively turning on each column of transmission gate cells comprises a shift register.

12. A semiconductor test chip as claimed in claim 1, comprising a 128×256 array of cells with twelve I/O pads located on the chip.

13. A semiconductor test chip as claimed in claim 1, characterized in that said operational amplifier is located off the chip.

14. A semiconductor test chip as claimed in claim 1 wherein method of evaluating the performance of a semiconductor fabrication process for making CMOS Integrated Circuits, comprises fabricating said test chip said process, applying said predetermined bit patterns to said row inputs, sensing the tri-level codes at the row outputs for the predetermined bit patterns applied to the row inputs at Hi-Z, i.e. with all transmission gates off, and with the columns of cells selectively turned ON, and determining from the tri-level coded outputs the physical nature and location of the defects in the chip.

15. A method as claimed in claim 14, characterized in that said scheme is such that the cells are probed by applying to the inputs of all the rows, said row inputs being connected to the sources of all the cells in the row, a logic 0 and 1 according to the following scheme:

| Row | Bit Patterns | | | |
|---|---|---|---|---|
| n−1 | 0 | 1 | 0 | 1 |
| n | 0 | 0 | 1 | 1 |
| n+1 | 0 | 1 | 0 | 1 |

16. A method as claimed in claim 15, characterized in that the cells are probed first by turning off all transmission gate cells (HI-Z) and probing all rows and sensing the tri-level outputs, and second by selectively turning on each column and again sensing the tri-level outputs.

17. A method as claimed in claim 14, characterized in that the faults are determined from the tri-level coded outputs as follows:

| Defect possible | HI-Z | HI-Z Y-dir | Local | X−dir | Y-dir | XY |
|---|---|---|---|---|---|---|
| DsN | 0000 | | 00XX | 00XX | | X |
| DsP | 1111 | | XX11 | XX11 | | X |
| GSN | XX0X* | XX0X* | XX11 | 00XX | XX11 + | XY |
| GSP | X1XX* | X1XX* | 00XX | XX11 | | XY |
| GDN | 0000 | | 00XX | XX11 | | XY |
| GDP | 1111 | | XX11 | 00XX | | XY |
| GG | 0011 | 0011 | | | | XY |
| DS | 0011 | | | | | Y |
| $S_nD_{n-1}$ | 0011 | | 0XX1 | 0XX1 | | Y |
| GOP | 00XX | | | | | Y |
| GON | XX11 | | | | | Y |
| $S_nS_{n-1}O$ | | | XXXX | XXXX + | | XY |
| SSO | | | XX11 | XXXX* | | XY |

-continued

| Defect possible | HI-Z | HI-Z Y-dir | Local | X−dir | Y-dir | XY |
|---|---|---|---|---|---|---|
| DDO | | | 00XX | XXXX − | | XY |
| $D_nD_{n+1}O$ | | | XXXX | XXXX − | | XY |
| SsN | | | 00XX | 00XX | | Y |
| Ssp | | | XX11 | XX11 | | Y |
| GsN | | | XX11 | | XX11 + | X* |
| GsP | | | 00XX | | 00XX + | X* |
| DON | | | XX11 | | | XY |
| DOP | | | 00XX | | | XY | where the codes have the following meanings:

| | |
|---|---|
| 0: | logic zero |
| 1: | logic one |
| X: | intermediate level within defined limits |
| DsN: | drain substrate short |
| DsP: | |
| GSN: | gate source short |
| GSP: | |
| GDN: | |
| GDP: | |
| GG: | gate n-gate p short |
| DS: | drain-source short |
| $S_nD_{n-1}$: | short of the drain to the source of the transistor below (Metal-Metal) |
| GOP: | gate open |
| GON: | |
| $S_{n-1}S_nO$: | source open between cells of the same row |
| SSO: | source open between transistors of the same cell |
| DDO: | |
| $D_nD_{n+1}O$: | |
| SsN: | source-substrate short |
| Ssp: | |
| GsN: | |
| GsP: | |
| DON: | drain open N channel, note: SON.is the same |
| DOP: | |

HI-Z represents the code seen at the output of the probed row in the high impedance state as the 0011 bit pattern is applied to its input, The HI-Z Y dir column shows those defects that cause the error to propagate from the row containing the defective cell to the bottom of the array;

The Local column shows the sensed output pattern for all rows when a defective cell of a probed row is selected;

The X dir column shows the code seen on the defective row as the columns are selected in turn; +means from defect position to far right, −from far left to defect position;

The Y dir column shows the code seen in the defective column as the output rows are scanned in turn; +means from the defect to the bottom of the array, −means from the top of the array to the row containing the defective cell;

The X-Y Possible column indicates the coordinates that can be identified from the output codes; a * means the identification is not straight forward for the missing direction but can be calculated approximately.

* * * * *